(12) United States Patent
Lai

(10) Patent No.: US 7,843,133 B2
(45) Date of Patent: Nov. 30, 2010

(54) WHITE LIGHT EMITTING DEVICE WITH PARTICULAR LIGHT EMITTING STRUCTURE

(75) Inventor: Chih-Ming Lai, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 184 days.

(21) Appl. No.: 12/135,853

(22) Filed: Jun. 9, 2008

(65) Prior Publication Data
US 2009/0058263 A1  Mar. 5, 2009

(30) Foreign Application Priority Data
Aug. 28, 2007  (CN) .................. 2007 1 0201498

(51) Int. Cl.
H01J 1/62 (2006.01)
H01J 63/04 (2006.01)
(52) U.S. Cl. .................. 313/506; 313/498; 313/503; 313/512
(58) Field of Classification Search .......... 313/498–512
See application file for complete search history.

(56) References Cited

U.S. PATENT DOCUMENTS

| 6,720,584 B2 | 4/2004 | Hata et al. | |
| 2004/0041220 A1* | 3/2004 | Kwak et al. | 257/432 |
| 2004/0135504 A1* | 7/2004 | Tamaki et al. | 313/512 |
| 2006/0076883 A1* | 4/2006 | Himaki et al. | 313/503 |
| 2006/0170332 A1* | 8/2006 | Tamaki et al. | 313/498 |
| 2007/0145883 A1* | 6/2007 | Ohashi et al. | 313/498 |
| 2009/0140630 A1* | 6/2009 | Kijima et al. | 313/498 |

FOREIGN PATENT DOCUMENTS

| CN | 1481032 A | 3/2004 |
| CN | 1619849 A | 5/2005 |
| JP | 59-165475 A | 9/1984 |
| WO | 2007036214 A1 | 4/2007 |

* cited by examiner

*Primary Examiner*—Bumsuk Won
*Assistant Examiner*—Kevin Quarterman
(74) *Attorney, Agent, or Firm*—Andrew C. Cheng

(57) ABSTRACT

A white light emitting device and a method for making the same are provided. The white light emitting device includes a light emitting diode (LED) chip, a fluorescent layer and a reflective layer. The LED chip includes a substrate and a light emitting structure formed on the substrate. The LED chip has a plurality of side walls. The light emitting structure includes a first-type semiconductor layer, an active layer and a second-type semiconductor layer arranged in that order along a direction away from the substrate. The substrate has through hole formed therethrough and the first-type semiconductor layer is partially exposed. The fluorescent layer is formed in the through hole for wavelength conversion. The reflective layer is formed on the side walls and surrounds the LED chip.

14 Claims, 6 Drawing Sheets

WHITE LIGHT EMITTING DEVICE WITH PARTICULAR LIGHT EMITTING STRUCTURE

TECHNICAL FIELD

The present invention generally relates to solid state light emitting devices and, particularly, to a white light emitting device and a method for making the same.

DESCRIPTION OF RELATED ART

Nowadays, white light emitting devices such as white light emitting diodes (white LEDs) have been widely used for display, backlight, automobile illumination, general illumination and so on, due to their advantages of low-power consumption, long lifespan, small size and high brightness. A white LED has been described in detail in a document published by Atsushi Okuno et al. on 2003 IEEE Electronic Components and Technology Conference, entitled "Unique White LED Packaging Systems", the disclosure of which is fully incorporated herein by reference.

As shown in FIG. 6, a typical white LED 60 includes a substrate 62, a LED chip 64, and a transparent encapsulation 66 having a fluorescent substance mixed therein for wavelength conversion. The LED chip 64 is disposed on the substrate 62 and sealed by transparent encapsulation 66. Generally, under excitation, light emits from a top surface as well as side surfaces of the LED chip 64. However, the light emitted from the top surface and the light emitted from the side surface have different intensities and optical paths of passing through the transparent encapsulation 66, which would result in a low color uniformity for a resultant white light generated from the white LED 60. As a result, the applications of the white LED 60 are limited to some degree.

Therefore, what is needed is a white light emitting device with high color uniformity and a method for making the same.

SUMMARY

A white light emitting device, in accordance with a present embodiment, is provided. The white light emitting device includes a light emitting diode (LED) chip, a fluorescent layer and a reflective layer. The LED chip has a plurality of side walls. The LED chip includes a substrate and a light emitting structure formed on the substrate. The light emitting structure includes a first-type semiconductor layer, an active layer and a second-type semiconductor layer arranged in that order along a direction away from the substrate. The first-type semiconductor layer and the second-type semiconductor layer have opposite conductive types with respect to each other. The substrate has through hole formed therethrough and the first-type semiconductor layer is partially exposed. The fluorescent layer is formed in the through hole for being excited to emit white light. The reflective layer is formed on the side walls and whereby surrounds the LED chip.

A white light emitting device includes a substrate, a first-type semiconductor layer, an active layer, a second-type semiconductor layer, a fluorescent layer, and a reflective layer. The substrate has a through hole defined therein. The first-type semiconductor layer is formed on the substrate, and the first-type semiconductor layer has a surface proximate to the substrate. The surface has a central portion exposed through the through hole and a peripheral portion covered by the substrate and surrounding the central portion. The active layer is formed on the first-type semiconductor layer. The second-type semiconductor layer is formed on the active layer. The fluorescent layer is formed on the first-type semiconductor layer in the through hole for being excited to emit white light. The reflective layer is enclosing the first-type semiconductor layer, the active layer and the second-type semiconductor layer therein.

A light emitting device includes a solid-state light emitting chip, a fluorescent layer, and a reflective layer. The solid-state light emitting chip includes a substrate and a light emitting structure epitaxially grown on the substrate. The substrate has a through hole and the light emitting structure partially exposed through the through hole. The fluorescent layer is received in the through hole. The reflective layer surrounds the solid-state light emitting chip therein.

Due to the provision of the reflective layer which is formed on the side walls of the light emitting diode chip and surrounds the light emitting diode chip and the positional configuration of the fluorescent layer, light is prevented to output from the side walls of the light emitting diode chip and directed to pass through the through hole of the substrate and the fluorescent layer for wavelength conversion. Accordingly, the conventional drawbacks associated with the light intensity and optical path differences can be overcome and the color uniformity of a white light generated from the present white light emitting device can be greatly improved.

Other advantages and novel features will become more apparent from the following detailed description of embodiments, when taken in conjunction with the accompanying drawings.

BRIEF DESCRIPTION OF THE DRAWINGS

Many aspects of the present white light emitting device and the present method for making same can be better understood with reference to the following drawings. The components in the drawings are not necessarily drawn to scale, the emphasis instead being placed upon clearly illustrating the principles of the present white light emitting device and the present method. Moreover, in the drawings, like reference numerals designate corresponding parts throughout the several views.

The exemplifications set out herein illustrate various preferred embodiments, in various forms, and such exemplifications are not to be construed as limiting the scope of the present white light emitting device and the present method in any manner.

DETAILED DESCRIPTION

Figure 1:
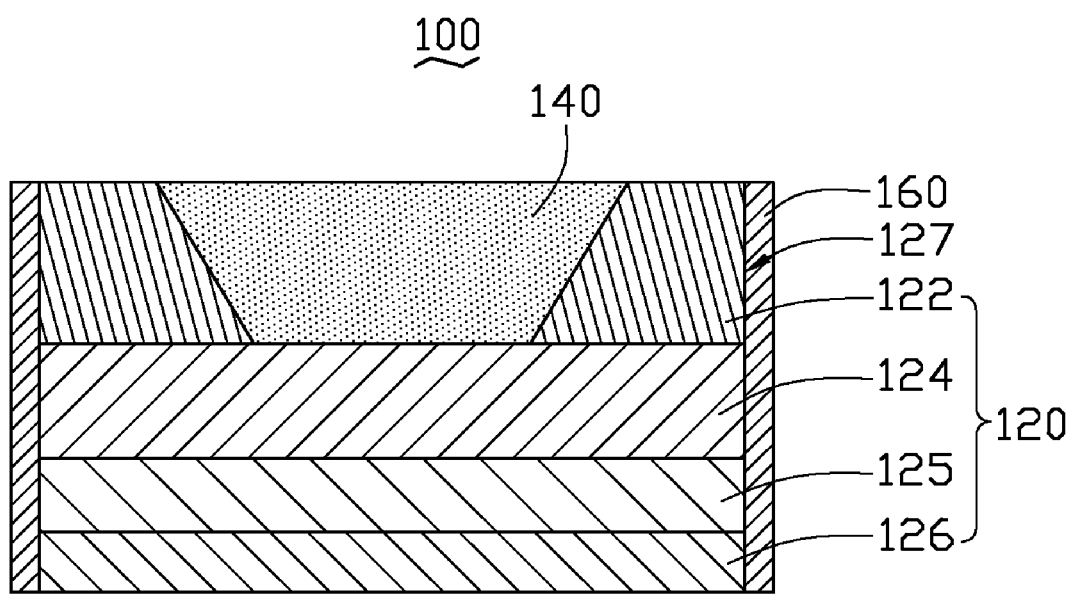
FIG. 1 is a schematic, cross-sectional view of a white light emitting device, in accordance with a present embodiment.
Figure 2:
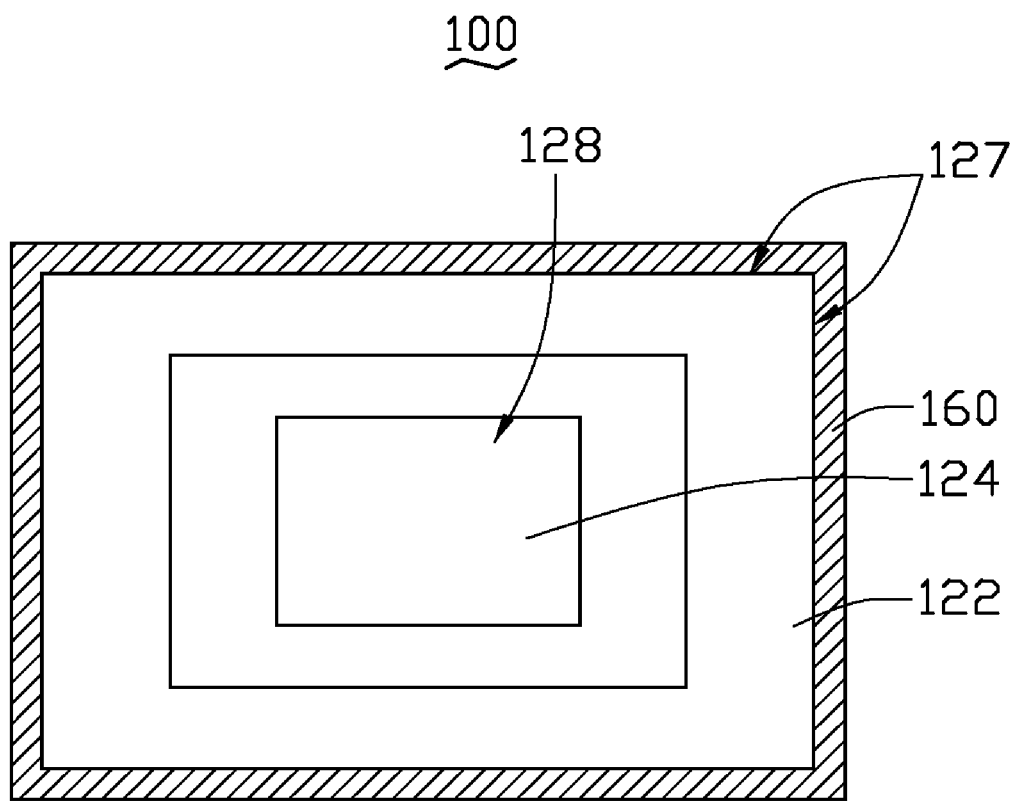
FIG. 2 is schematic, top view of the white light emitting device of FIG. 1.
Figure 3:
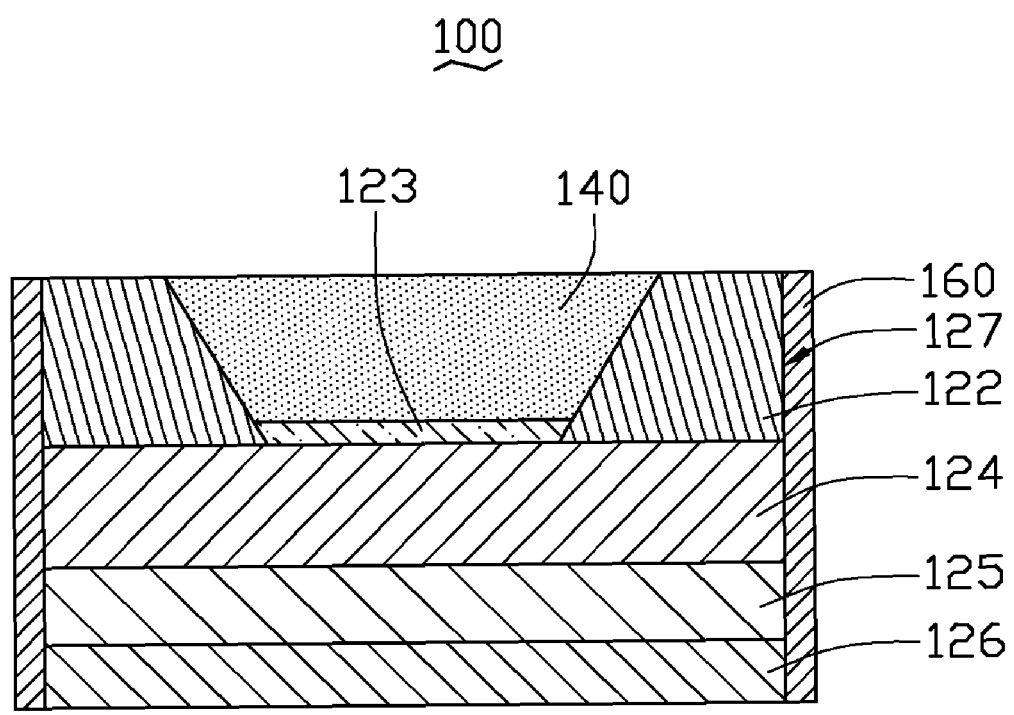
FIG. 3 is a schematic, cross-sectional view of another white light emitting device, in accordance with a present embodiment.

Referring to FIGS. 1 through 3, a white light emitting device 100 in accordance with a present embodiment is provided. The white light emitting device 100 includes a light emitting diode (LED) chip 120, a fluorescent layer 140 and a reflective layer 160.

The LED chip 120 includes a substrate 122 and a light emitting structure formed on the substrate 122. The LED chip 120 has a plurality of side walls 127. The light emitting structure includes an n-type layer 124, an active layer 125 and a p-type layer 126 arranged in that order along a direction away from the substrate 122. That is, the active layer 125 is sandwiched between the n-type layer 124 and the p-type layer 126. The n-type layer 124 has an opposite conductive type with respect to the p-type layer 126. It is indicated that the light emitting structure can only include the n-type layer 124 and the p-type layer 126 and thus the active layer 125 can be omitted. The n-type layer 124, the active layer 125 and the p-type layer 126 individually can be made from a nitride-based semiconductor material selected from binary, ternary and quaternary nitride-based semiconductor materials. A wavelength of light emitted from the LED chip 120 is generally ranged from 200 to 540 nanometers. The active layer 125 generally is a multiple quantum well (MQW) structure. For the purpose of illustration, the n-type layer 124 and the p-type layer 126 respectively are an n-type aluminum indium gallium nitride (AlInGaN) and a p-type AlInGaN.

The substrate 122 has a through hole 128 formed therethrough and the n-type layer 124 is partially exposed. Advantageously, a current spreading layer 123 (as shown in FIG. 3) is disposed in the through hole 128 and on top of the n-type layer 124. The through hole 128 taperes along a direction close to the n-type layer 124. The through hole 128 has a trapezoid cross section and oblique surfaces on the inner walls thereof. A bottom opening (not labeled) of the through hole 128 adjacent to the n-type layer 124 is smaller than a top opening (not labeled) of the through hole 128 spaced apart from the n-type layer 124. An area of the bottom opening is smaller than an area of a top surface of the n-type layer 124 adjacent to the substrate 122. A length of the through hole 128 corresponds to a thickness of the substrate 122. In addition, it is understood that the through hole 128 is not limited to taper as illustrated in FIGS. 1 and 2, it can be other shaped through hole such as a rectangular cross-section through hole and inner walls of the rectangular cross-section through hole are perpendicular surfaces.

The substrate 122 can be made from a metal, a metal alloy, a semiconductor material or a transparent insulating material. For the purpose of illustration, the semiconductor material can be silicon or silicon carbide (SiC); the transparent insulating material can be zinc oxide (ZnO), silicon dioxide (SiO2), lanthanun oxide (LaO), magnesium oxide (MgO) or sapphire. For one example, when the substrate 122 is made from a metal or a metal alloy, the substrate 122 can be in ohmic contact with the n-type layer 124 and thus acts as a negative electrode of the white light emitting device 100, and a positive electrode (not shown) of the white light emitting device 100 can be formed on the p-type layer 126. The negative electrode and positive electrode are used to cooperatively supply electrical power to the LED chip 120. In this circumstance, the oblique inner walls of the through hole 128 are metal reflective surfaces and thus have the light reflection property. For another example, when the substrate 122 is made from a transparent insulating material, the negative electrode of the white light emitting device 100 is necessarily formed on a side of the n-type layer 124 facing away from the substrate 122 and the positive electrode is formed on the p-type layer 126. For still another example, when the substrate 122 is made from a semiconductor material, the negative electrode can be a metal electrode (not shown) ohmic contacted with the substrate 122 instead and the positive electrode is formed on the p-type layer 126.

The fluorescent layer 140 is formed in the through hole 128, for being excited to emit white light. In particular, the fluorescent layer 140 is filled in the through hole 128 and an outer surface of the fluorescent layer 140 facing away from the n-type layer 124 is a plat surface. The fluorescent layer 140 includes at least one fluorescent substance for wavelength conversion and a transparent resin. More specifically, when the LED chip 120 is a blue LED chip, the fluorescent layer 140 can contain a yellow fluorescent substance or a red and a green fluorescent substance for wavelength conversion; when the LED chip 120 is an ultraviolet (UV) LED chip, the fluorescent layer 140 can contain a red, a green and a blue fluorescent substances. The at least one fluorescent substance can be mixed in the transparent resin. The transparent resin can be silicone or other resin such as epoxy resin.

The reflective layer 160 is formed, e.g., formed on the side walls 127 of the LED chip 120 and whereby surrounds the LED chip 120. The provision of the reflective layer 160 is to prevent light to output from the side walls 127 of the LED chip 120 and thus leakage of light at the side walls 127 can be suppressed. Therefore, light emitted from the LED chip 120 can be effectively guided to pass through the fluorescent layer 140 for wavelength conversion so as to form a white light. The reflective layer 160 can be made from a metal or a dielectric material. The dielectric material can be silicon nitride (SiNx) or silicon dioxide.

In the above-described embodiment, in one aspect, the light leakage at the side walls 127 can be effectively avoided due to the light reflection of the reflective layer 160; in another aspect, the light emitted from the LED chip 120 is guided to pass through the fluorescent layer 140 for wavelength conversion and then appears to be a white light. Lights passing through the fluorescent layer 140 would have substantially identical optical paths with each other, so that the white light outputted from the white light emitting device 100 can achieve a good color uniformity.

Figure 4:
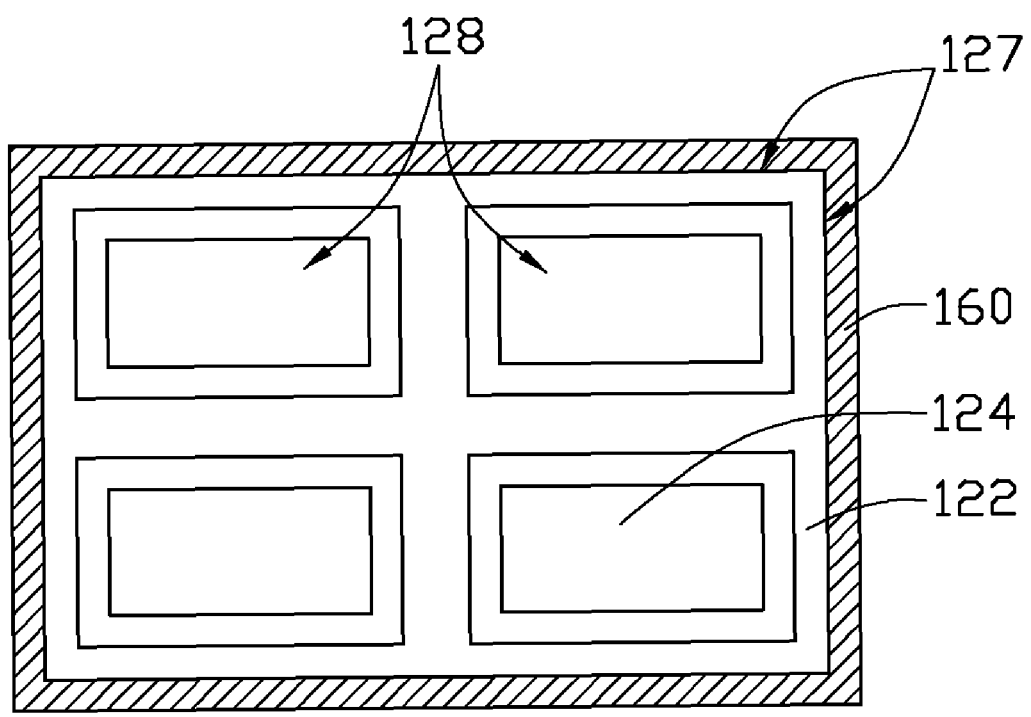
FIG. 4 is a schematic, top view of still another white light emitting device, in accordance with a present embodiment.

Referring to FIG. 4, the through hole 128 in the foregoing embodiment is not limited to one, but multiple (e.g., four). The four through holes 128 are arranged in an array. A total area of the bottom openings of the through holes 128 in FIG. 4 is substantially equal to or smaller than the area of the top surface of the n-type layer 124 adjacent to the substrate 122.

Figure 5:
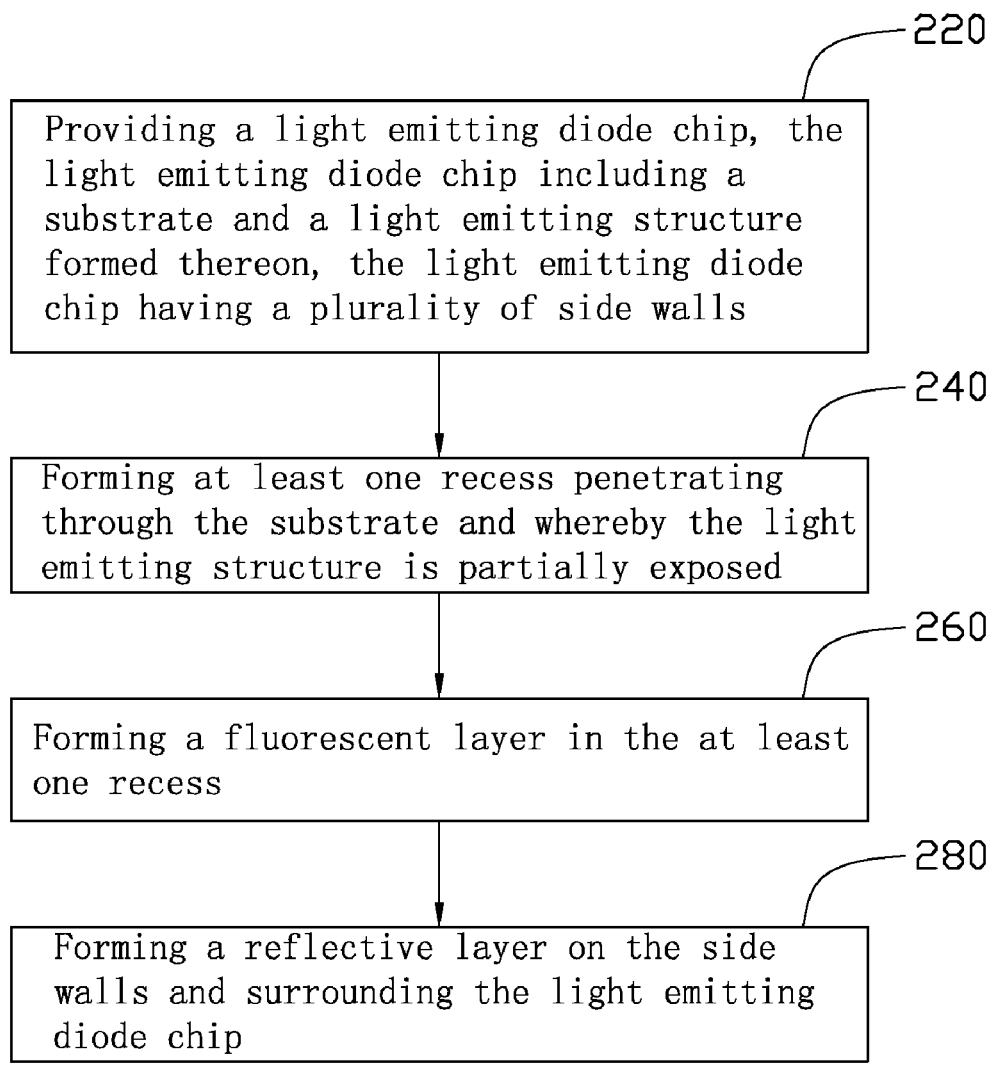
FIG. 5 is a flow chart of a method for making a white light emitting device, in accordance with a present embodiment.
Figure 6:
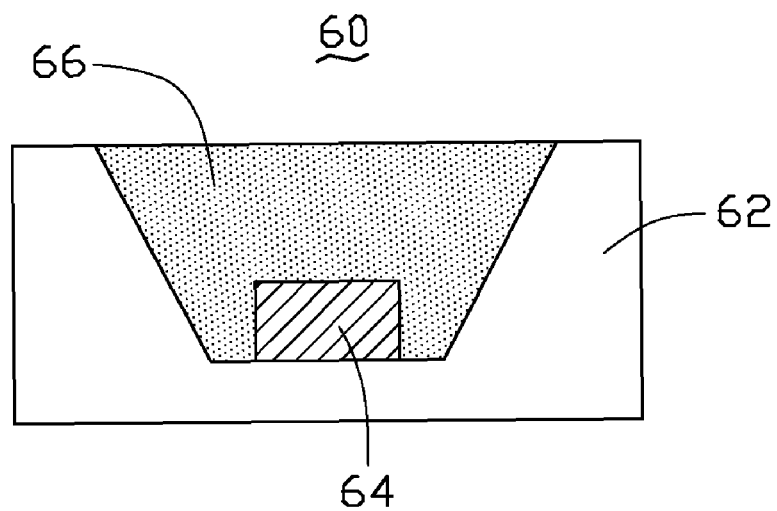
FIG. 6 is a schematic view of a conventional white light emitting device.

Referring to FIG. 5 with FIGS. 1 and 2 together, a method for making the above-described white light emitting device 100 will be described below in detail with reference to the accompanying drawings.

In the step 220: a LED chip is provided. The LED chip includes a substrate and a light emitting structure formed on the substrate; the LED chip has a plurality of side walls 127. More specifically, the light emitting structure generally includes the n-type layer 124, the p-type layer 126, and the active layer 125 sandwiched therebetween. The light emitting structure can be epitaxially grown on the substrate by a molecular beam epitaxy (MBE) process, or a metal organic chemical vapor deposition (MOCVD) process, etc.

In the step 240: at least one through hole is formed penetrating through the substrate of the LED chip and the light emitting structure is partially exposed. In particular, the at least one through hole 128 can be formed on the substrate by an etching process, a mechanical processing process or laser machining process, and the n-type layer 124 is partially exposed. The etching process can be a dry etching process such as inductively coupled plasma-reactive ion etching (ICP-RIE) process, or a wet etching process such as a photo-enhanced chemical etching process.

In the step 260: a fluorescent layer is formed in the at least one through hole 128. The formation of the fluorescent layer 140 actually can be a result of several sub-steps as follows. (a) A colloidal material containing at least one fluorescent substance is filled in the at least one through hole 128, (b) excessive colloidal material is then removed so as to flatten a surface of the colloidal material facing away from the n-type layer 124, and (c) the colloidal material is solidified to form the fluorescent layer 140.

In the step 280: a reflective layer is formed on the side walls 127 of the LED chip 120 and whereby surrounds the LED chip 120. Generally, a shielding member (not shown) is firstly provided to protect the LED chip 120 with only the side walls 127 being exposed. The reflective layer 160 is then formed on the side walls 127 of the LED chip 120 by an optical coating process e.g., facet coating process. As such, a white light emitting device 100 can be obtained.

In one embodiment, before the step 240 is carried out, a step of bonding or mounting the LED chip on a carrier plate can be performed. The carrier plate and the substrate are located at opposite sides of the light emitting structure of the LED chip. Such step can prevent the LED chip from stress damage during the formation of the at least one through hole 128, so that a yield for making the white light emitting device 100 can be improved.

In another embodiment, before the step 260 is carried out, a step of forming a current spreading layer 123 (as illustrated in FIG. 3) on the n-type layer 124 of the LED chip 120 and in the at least one through hole 128 can be implemented.

It is indicated that, in the foregoing embodiments, the positions of the n-type layer 124 and the p-type layer 126 can be exchanged with each other. The white light emitting device 100 can be formed by a batch process. In particular, before the formation of the at least one through hole 128 and the fluorescent layer 140 for each LED chip, a wafer having a plurality of the LED chip formed thereon is provided. The formation steps of the at least one through hole 128 and the fluorescent layer 140 are then implemented before dicing the wafer, and the formation step of the reflective layer is performed after dicing the wafer.

In addition, a person skilled in the art can perform various changes within the spirit of the present embodiment, such as varying the number and/or the shape of the through hole 128, the material and/or the structural configurations of the n-type layer 124, the active layer 125 and the p-type layer 126, etc.

It is believed that the present embodiments and their advantages will be understood from the foregoing description and it will be apparent that various changes may be made thereto without departing from the spirit and scope of the invention or sacrificing all of its material advantages, the examples hereinbefore described merely being preferred or exemplary embodiments of the present invention.

What is claimed is:

1. A white light emitting device, comprising:
   a light emitting diode chip including a substrate and a light emitting structure formed on the substrate, the light emitting diode chip having a plurality of side walls, wherein the light emitting structure comprises a first-type semiconductor layer, an active layer and a second-type semiconductor layer arranged in that order along a direction away from the substrate, the first-type semiconductor layer and the second-type semiconductor layer have opposite conductive types with respect to each other, the substrate has a through hole formed therethrough and the first-type semiconductor layer is partially exposed;
   a fluorescent layer formed in the through hole for being excited to emit white light; and
   a reflective layer formed on the side walls and surrounding the light emitting diode chip.

2. The white light emitting device of claim 1, wherein the through hole tapers along a direction from the substrate to the first-type semiconductor layer.

3. The white light emitting device of claim 1, wherein a length of the through hole is less than or equal to 400 micrometers.

4. The white light emitting device of claim 1, wherein an area of an opening of the through hole proximate to the first-type semiconductor layer is smaller than an area of a surface of the first-type semiconductor layer proximate to the substrate.

5. The white light emitting device of claim 1, wherein the fluorescent layer is filled in the through hole, and an outer surface of the fluorescent layer facing away from the first-type semiconductor layer is substantially flat.

6. The white light emitting device of claim 5, wherein the fluorescent layer is a solidified colloidal material containing at least one fluorescent substance.

7. The white light emitting device of claim 1, wherein the reflective layer is formed on the side walls and made from one of a metal and a dielectric material.

8. The white light emitting device of claim 1, further comprising a transparent current spreading layer disposed in the through hole and on the top of the first-type semiconductor layer.

9. The white light emitting device of claim 1, wherein the substrate is made from one of a semiconductor material and a transparent insulating material.

10. The white light emitting device of claim 1, wherein the substrate is made from a metal or a metal alloy.

11. The white light emitting device of claim 1, wherein a wavelength of light emitted from the light emitting diode chip is ranged from 200 to 540 nanometers.

12. The white light emitting device of claim 1, wherein the first-type semiconductor layer, the active layer and the second-type semiconductor layer are made from nitride-based semiconductor materials.

13. A white light emitting device comprising:
    a substrate defining a through hole therein;
    a first-type semiconductor layer formed on the substrate, the first-type semiconductor layer having a surface proximate to the substrate, the surface having a central portion exposed through the through hole and a peripheral portion covered by the substrate and surrounding the central portion;
    an active layer formed on the first-type semiconductor layer;
    a second-type semiconductor layer formed on the active layer;
    a fluorescent layer formed on the first-type semiconductor layer in the through hole for being excited to emit white light; and
    a reflective layer enclosing the first-type semiconductor layer, the active layer and the second-type semiconductor layer therein.

14. A light emitting device, comprising:
    a solid-state light emitting chip including a substrate and a light emitting structure epitaxially grown on the substrate, the substrate having a through hole and the light emitting structure partially exposed through the through hole;
    a fluorescent layer received in the through hole; and
    a reflective layer surrounding the solid-state light emitting chip therein.

* * * * *